United States Patent [19]

Fleischer et al.

[11] Patent Number: 4,954,807
[45] Date of Patent: Sep. 4, 1990

[54] COMBINATION INSTRUMENT FOR AUTOMOTIVE VEHICLES

[75] Inventors: Helmut Fleischer, Niddatal; Ernst-Ulrich Simon, Oberursel; Günter Schmitt, Kelkheim, all of Fed. Rep. of Germany

[73] Assignee: VDO Adolf Schindling AG, Frankfurt am Main, Fed. Rep. of Germany

[21] Appl. No.: 257,988

[22] Filed: Oct. 13, 1988

[30] Foreign Application Priority Data

Oct. 30, 1987 [DE] Fed. Rep. of Germany ....... 3736761
Jan. 12, 1988 [DE] Fed. Rep. of Germany ....... 3800572

[51] Int. Cl.$^5$ .............................................. B60Q 3/04
[52] U.S. Cl. ..................... 340/459; 333/185
[58] Field of Search ............. 340/459, 438; 174/35 R; 361/424; 336/175, 176; 333/182, 185; 307/10.1

[56] References Cited

U.S. PATENT DOCUMENTS

| | | | |
|---|---|---|---|
| 3,023,383 | 2/1962 | Schlicke | 333/185 X |
| 4,144,509 | 3/1979 | Boutros | 333/185 X |
| 4,325,103 | 4/1982 | Ito et al. | 174/35 R X |
| 4,486,817 | 12/1984 | Matsumura et al. | 361/424 |
| 4,494,092 | 1/1985 | Griffin | 333/182 |
| 4,563,658 | 1/1986 | Ikeda | 333/185 X |
| 4,642,589 | 2/1987 | Chambers | 333/185 X |
| 4,668,873 | 5/1987 | Ohba et al. | 361/424 X |
| 4,675,629 | 6/1987 | Sakamoto et al. | 333/182 |
| 4,754,101 | 6/1988 | Stickney et al. | 174/35 R |

FOREIGN PATENT DOCUMENTS 3515910  11/1986  Fed. Rep. of Germany .

Primary Examiner—Joseph A. Orsino
Assistant Examiner—Brian R. Tumm
Attorney, Agent, or Firm—Martin A. Farber

[57] ABSTRACT

A combination instrument for automotive vehicles, in which different indicating instruments, indicating fields, control and warning lights, and, possibly, operating parts as well as electrical and electronic equipment parts, are arranged in common housing. The combination instrument comprises a computer unit with microcomputers (36) and/or use-specific integrated circuits which are arranged, for protection against electromagnetic disturbances, within a housing (31) which is impervious to high frequencies. Furthermore, disturbance-endangered incomiing and outgoing lines (41, 43, 46) are protected, upon entrance or exit, by suitable filter measures. These include leadthroughs with leadthrough capacitors (45) and the use of ferrite cores (47, 48) through which connecting lines are extended. For shielding against disturbing radiation and for obtaining a low profile of installation, in one embodiment, a lower part (38) of a multiple-plug-type connector is fastened on a least one outer surface of the high-frequency-proof housing, and electrical contacts are formed by elongated conductors (32) which extend in a single piece from a circuit board (33) through a housing wall (34) into the plug-type connector.

5 Claims, 4 Drawing Sheets

COMBINATION INSTRUMENT FOR AUTOMOTIVE VEHICLES

FIELD AND BACKGROUND OF THE INVENTION

The present invention refers to a combination instrument for automotive vehicles in which different indicating instruments, indicating fields and control and warning lights and, possibly, operating parts as well as electric and electronic equipment parts are arranged in a common housing and covered by a common transparent glass.

Such combination instruments have been known for a long time and are used to check different functions of an 38tomotive vehicle instead of the previously customary individual instruments. For this purpose, depending on the amount of equipment, they contain, for instance, a tachometer, odometer, speedometer, fuel indicator, cooling-water temperature indicator, clock, warning lights for oil pressure, generator, high beam, direction-of-travel indicators and the like, such as, for instance, monitoring and computing systems together with their display systems, and they are arranged in the vehicle, in each case within the field of view of the driver, in a suitably shaped instrument holder which, in its turn, is fastened to the body.

Electrically controlled displays are being used to an increasing extent in such combination instruments, they making possible, in addition to greater freedom in development, a more intelligent control and thus more precise or more meaningful displays. The control is effected, in general, by the use of microprocessors or highly integrated circuits which are specific to the use. The digital pulse trains which are processed therein have very steep flanks and are also of high frequency. As a result, they produce disturbing radio frequencies which, upon operation of the vehicle may affect other electronic systems present or make radio reception or radio communication difficult. At the same time however, these trains of pulses are also sensitive to disturbances from the outside. Such disturbances may come from other electronic systems of the high-voltage ignition system even of other vehicles, or from strong radio or television transmitters in the vicinity.

In principle, there is furthermore continuous interest in seeing to it that the equipment for automotive vehicles takes up less space so as to increase the room available for the passengers.

While a housing with connection terminals which are impervious to high frequencies is known (Federal Republic of Germany OS No. 35 15 910), it involves a junction or splitter for cable television systems with a network of coaxial cables.

SUMMARY OF THE INVENTION

It is an object of the invention so to improve a combination instrument of this type so that the effects of both incoming linebound and non-linebound disturbances are suppressed, and the wireless propagation of outward going radio frequency pulse trains is reduced. At the same time, the installation depth is to be reduced.

According to the invention, a display computer 36 is provided which is arranged on a circuit board 25 within a housing (31) which is substantially impervious to high frequencies.

It is advantageous here that aspects of the invention refer to only a part of the combination instrument.

It is also advantageous that the existing structure of a combination instrument need not be fundamentally changed.

According to a feature of the invention, the peripheral wiring of the computer unit (36) is also arranged in the housing (31) which is impervious to high frequency.

Still further, for passage of connecting lines (41, 43, 46) at the circuit board (33) for a computer unit (36), connection terminals (37, 38, 39) are provided.

According to a further feature, the housing shell (32) of the housing (31) which is impervious to high frequencies is formed, in each case, as a sheet metal shell 40 which surrounds the connection terminals (37, 38, 39).

Another feature of the invention is that the diameter and length of the sheet metal shell (40) as well as the material of the connecting terminal (37) are selected in accordance with the capacitance to be obtained in a capacitor which is formed from the sheet metal shell (40) and a line (41) which passes through the shell.

Also, the invention provides that a line (43) is conducted by a leadthrough capacitor (45) through the connection terminal (38).

Yet further, by the invention, a line (46) passes at least once through a ferrite core in the immediate vicinity of the connection terminal (39).

Among other things, it is advantageous that, as a result of the one-piece development of the contact pins extending from the circuit board into the plug housing, the installation can be kept small. In this way, the connections from the board to contact pins which are fastened separately in the part of the plug are dispensed with. Thus, the instrument of the invention is, as a whole, more reliable.

Furthermore by the invention, on at least one outer surface of the high-frequency-proof housing, the lower part (38) of a multiple-plug-type connector is fastened, and the electrical contacts are formed by elongated conductors (32) which extend in one piece from the circuit board (33) through the housing wall (34) into the plug device.

The invention also provides that the elongated conductors are contact pins which are guided by means of lead-through capacitors (37) through openings (36) in the housing wall (34).

Yet another feature of the invention is that the elongated conductors (32) pass at least once through a ferrite core (48).

BRIEF DESCRIPTION OF THE DRAWINGS

With the above and other objects and advantages in view, the present invention will become more clearly understood in connection with the detailed description of preferred embodiments, when considered with the accompanying drawings, of which.

DETAILED DESCRIPTION OF THE PREFERRED EMBODIMENTS

Figure 1:
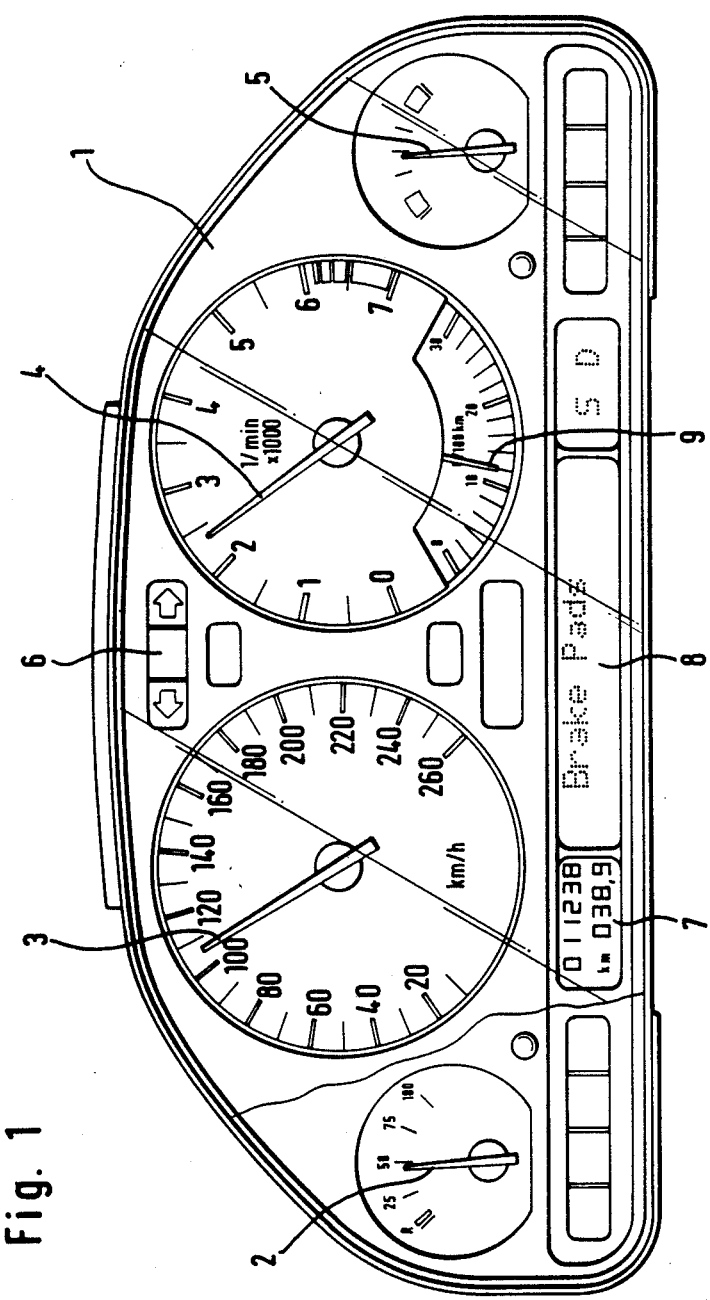
FIG. 1 is a front view of the combination instrument.

FIG. 1 shows the front panel 1 of a combination instrument which has, one alongside the other in substantially the same plane, a fuel gauge 2, a speedometer 3, a tachometer 4 with integrated consumption display 9, and a cooling-water temperature indicator 5. Also provided is a control light for the direction-of-travel indicator 6 as well as a liquid crystal display 7 for electronic odometer and a dot-matrix display 8 for various warning functions.

Figure 2:
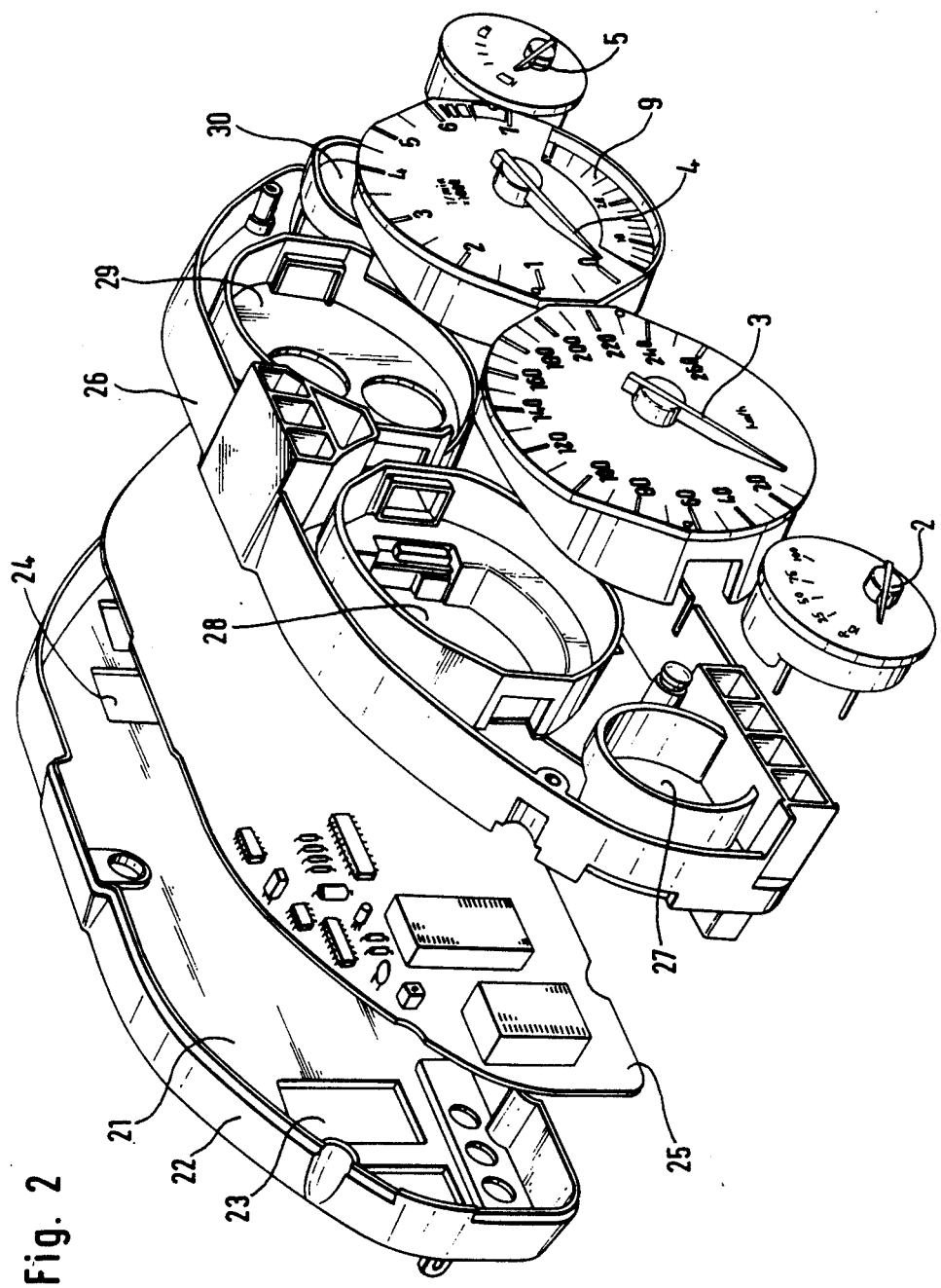
FIG. 2 shows the same combination instrument in an exploded perspective view, without front panel.

FIG. 2 shows the construction of the combination instrument. It comprises a rear wall 21 with rim 22 developed thereon. In the rear wall 21 there are a plurality of openings 23, 24 to receive plug connections which are provided for electrical connection of the combination instrument to the corresponding sensors and external circuits such as, for instance, a circuit for activating the direction indicators.

Within the rear wall 21 there can be inserted a circuit board 25 which contains all active and passive circuit elements, conductive paths, plug connectors and connecting points necessary for operation of the combination instrument. The circuit board 21, furthermore, bears a computer unit necessary for the signal processing, it consisting, for instance, of two single-chip microcomputers and use specific integrated circuits. This computer unit is arranged on the circuit board 25 in a manner which will be described further below.

In front of the circuit board 25 there is a support panel 26 which, in the same way as the rear wall 21, may consist of a thermoplastic resin of suitable composition produced by injection molding. Together with the rim 22 of the rear wall 21, it determines the outer shape of the combination instrument and has a number of openings 27, 28, 29, 30 to receive electromechanical display systems for the analog displays 2 to 5 and 9. These display systems can to a certain extent be replaced as components of the combination instrument, depending on the options in the equipment of the vehicle, and be suitably connected to the circuit board 25. Thus, instead of the tachometer 4 with integrated fuel indicator 9, a clock can be installed and operated. Similarly, electro optical displays can be used for the indicated display functions, with suitable shaping and design of the components used in the combination instrument.

As already mentioned at the start, the use of a highly integrated electronic system in a combination instrument of an automotive vehicle requires special measures for the suppression of noise in both directions. The computer unit is to be protected from disturbances from the outside and the other electronic devices of the vehicle from disturbances from the instrument computer.

Figure 3:
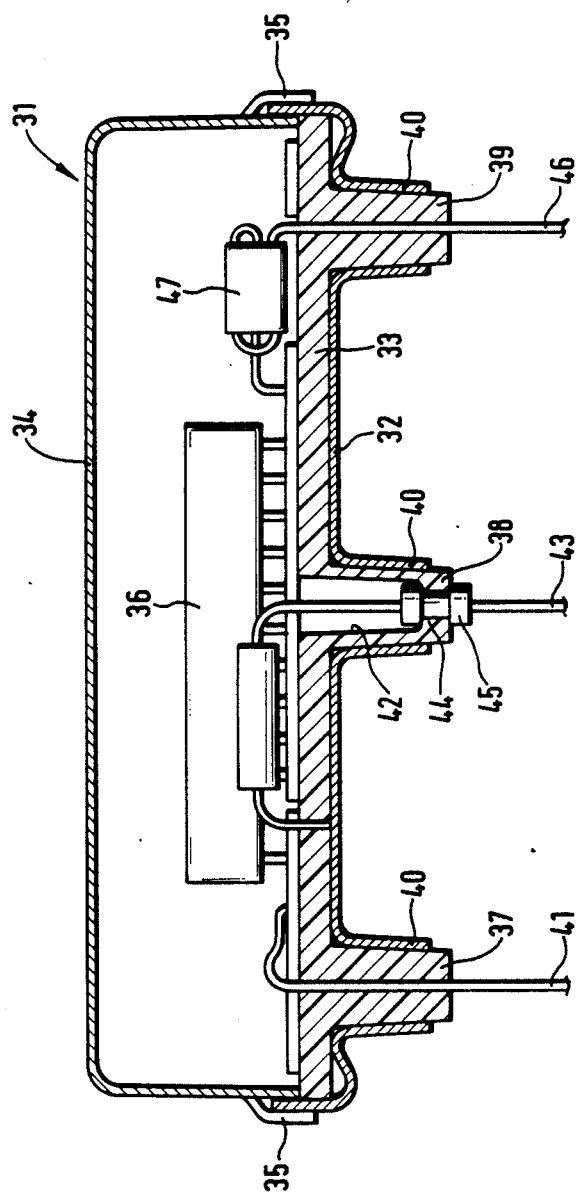
FIG. 3 is a diagram in sectional view of a housing to receive electronic circuits.

On the circuit board 25 (FIG. 2), a shielding housing 31, as shown in FIG. 3, is therefore fastened to receive the computer unit 36 and the peripheral wiring. The shielding housing 31 consists of a housing lower part 32 which is developed as a half shell to receive a circuit board 33 or a thick-film hybrid, and of a housing upper part 34. Housing lower part 32 and housing upper part 34 enclose the circuit board 33 and are impervious to high frequencies at their joining edges. For this purpose, there are provided at the edge of the housing upper part resilient or engaging interlocked tabs 35 which engage at distances apart over the rim of the housing lower part. Housing upper part 34 and housing lower part 32 can be soldered to each other after completion of the structural unit, in order to improve the imperviousness to high frequencies.

The computer unit 36 in the shielding housing 31 must, in order to assure its operation, be connected by different peripheral circuits directly to the sensors and display systems. It has been found that complete shielding of the incoming and outgoing lines is, as a rule, not necessary, but that it is sufficient that the lines which extend into and out of the shielding housing 31 be freed by filters from high and very high frequency disturbances. The circuit board 33 is provided for this purpose with connection terminals, each of which is intended for the passage of a connecting line, a number of which have been shown, by way of example, at 37, 38, 39. The housing lower part 32 is shaped conically in the region of the connection terminals 37, 38, 39, so that each connection terminal is surrounded up to the region of its end by a sheet-metal shell 40.

The sheet-metal shell 40, as part of the housing lower part 32, forms a capacitor of low capacitance with the line 41 which passes through the shell 40 and the insulating material of the connecting terminal 37. Capacitance of the capacitor depends on the length and diameter of the sheet-metal shell 40 and on the dielectric constant of the material used for the connection terminals 37. For slightly contaminated lines, this filtering may be sufficient by itself.

For lines which are more strongly affected by disturbances, an arrangement such as used in the connection terminal 38 is preferred. Here, the connection terminal 38 has a larger bore 42 which is traversed centrally by the line 43. In the closure wall 44 of the connection terminal 38, there is fastened a leadthrough capacitor 45, the filter action of which is advisedly adapted to the frequency of the most frequent and severe disturbances.

In accordance with another embodiment, the line 46 is guided through a ferrite core 47 after entrance into the shielding housing 31, so as to suppress the disturbances on the line 46. This measure can, if necessary, be combined with one of the two filter measures, with the formation or use of a capacitor. Similarly, it may be advisable to arrange the ferrite core on the outside of the shielding housing, directly on the connection terminal 39.

In a further development of the invention, the depth of insertion is to be increased only by the amount absolutely necessary.

Figure 4:
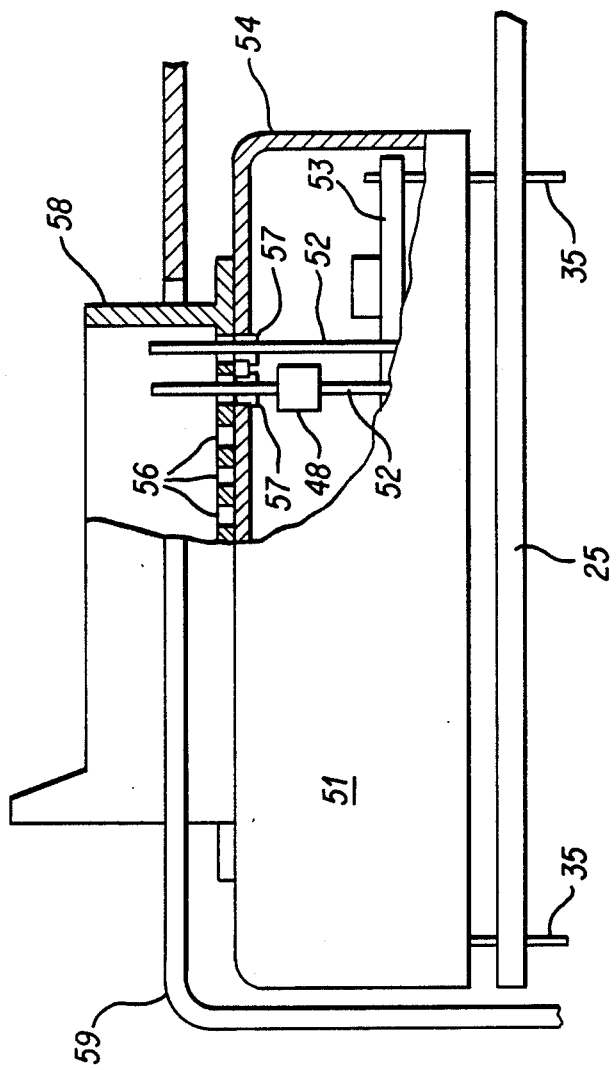
FIG. 4 is also a sectional view through another housing for the reception of electronic circuits.

On the circuit board 25 (FIG. 2) there is thus fastened, in a manner corresponding to FIG. 4, a shielding housing 51 to receive the computer unit 36 and the peripheral wiring. The shielding housing 51, in accordance with the preferred embodiment of the invention, can consist in this embodiment of a housing lower part 58 which is developed as a half-shell to receive a circuit board or a hybrid circuit and of a housing upper part 54. In FIG. 4, the bottom shielding housing is flat, the housing upper part 54 gripping over it and being connected to it in high-frequency-proof manner in accordance with one of the known techniques. A circuit board 53 is connected, on the one hand, mechanically and electrically by contact pins to the display systems on the circuit board 25 of the combination instrument while, on the other hand, contact pins 52 extend from the circuit board 53 through corresponding openings 56 in the housing upper part. Lead-through capacitors 57 in the openings 56 serve to filter out disturbances on the lines represented by the contact pins 52.

The contact pins 52 enter into a lower part 58, fastened on the housing upper part 54, of a plug-type connection consisting of two parts. Material, diameter and length of the contact pins 52 are so dimensioned that they serve as the solid contacts of a plug-type connection over which the jack contacts of a movable part of the plug-type connection grip and produce an electric contact.

The rear of the combination instrument, including circuit board 25 and shielding housing 51, is protected by a cover 59 from which, in this embodiment, only the lower part 58 of the plug-type connection extends. In this way, the desired minimal depth of installation is obtained and the resistance to disturbing radiation is improved.

The invention is not limited to use in a combination instrument for automotive vehicles. It is also possible to protect other electronic circuits in an automotive vehicle from linebound or non-linebound disturbances, in the manner indicated.

We claim:

1. In a combination instrument for automotive vehicles in which different indicating instruments, indicating fields and control and warning lights are arranged in a common housing and covered by a common transparent glass, the improvement wherein the instrument further comprises an inner housing, a display computer, and a circuit board, the computer being disposed on the circuit board within the inner housing, the inner housing being substantially impervious to high frequencies, the inner housing being located within said common housing;

a lower part of a multiple-plug-type connector fastened on at least one outer surface of said inner housing;

electrical contacts which are formed by elongated conductors which extend in one piece from said circuit board through a wall of said inner housing into said plug-type connector; and a ferrite core disposed in said inner housing; and wherein the elongated conductors are led at least once through the ferrite core.

2. The combination instrument according to claim 1, wherein peripheral wiring is provided for said computer, and is located in said inner housing.

3. A combination instrument according to claim 2, wherein said peripheral wiring includes connecting lines provided at said circuit board for said computer, there being connection terminals for carrying said connecting lines from said circuit board through ports of said inner housing.

4. In a combination instrument for automotive vehicles in which different indicating instruments, indicating fields and control and warning lights are arranged in a common housing and covered by a common transparent glass, the improvement wherein the instrument further comprises an inner housing, a display computer, and a circuit board, the computer being disposed on the circuit board within the inner housing, the inner housing being substantially impervious to high frequencies, the inner housing being located within said common housing;

a lower part of a multiple-plug-type connector fastened on at least one outer surface of said inner housing;

electrical contacts which are formed by elongated conductors which extend in one piece from said circuit board through openings in a wall of said inner housing into said plug-type connector; and lead through capacitors disposed in said openings in the wall of the inner housing and wherein;

the elongated conductors are contact pins which are guided by means of said lead-through capacitors through openings in the housing wall.

5. A combination instrument according to claim 4, further comprising a ferrite core; and wherein the elongated conductors are led at least once through the ferrite core.

* * * * *